United States Patent [19]

Auer, Jr. et al.

[11] Patent Number: 5,045,787
[45] Date of Patent: Sep. 3, 1991

[54] APPARATUS AND METHOD FOR MEASURING INSULATED TRACK JOINT RESISTANCES

[75] Inventors: John H. Auer, Jr., Fairport; Klaus H. Frielinghaus, Rochester, both of N.Y.

[73] Assignee: General Signal Corporation, Stamford, Conn.

[21] Appl. No.: 457,661

[22] Filed: Dec. 27, 1989

[51] Int. Cl.$^5$ .................. B61K 9/10; G01N 27/82
[52] U.S. Cl. ........................... 324/217; 324/557; 324/718; 324/606; 324/725
[58] Field of Search ............... 324/218, 217, 263, 526, 324/525, 606, 557, 725, 718

[56] References Cited

U.S. PATENT DOCUMENTS

| | | | |
|---|---|---|---|
| 1,765,715 | 6/1930 | Byers | 324/217 |
| 2,614,151 | 10/1952 | Gilson | 324/217 |
| 4,161,688 | 7/1979 | Nakayama | 324/526 |
| 4,651,086 | 3/1987 | Domenichini | 324/158 MG |
| 4,725,778 | 2/1988 | Brown | 324/263 |

FOREIGN PATENT DOCUMENTS 0017376  2/1983  Japan .................. 324/263

Primary Examiner—Kenneth A. Wieder
Assistant Examiner—Jose M. Solis
Attorney, Agent, or Firm—John F. Ohlandt

[57] ABSTRACT

A technique for measuring the insulation resistance of an insulated rail joint in the presence of leakage ground resistance (ballast resistance), as well as other track run-around paths, without the use of calibrated meters, such technique characterized by the use of a bridge circuit which includes a leg having the insulated joint therein whose resistance is being measured, the other three legs including a resistor of fixed known value and two variable resistors respectively, such that when the variable resistors are varied to obtain simultaneously both (a) the null of the rail, or ballast, current, and (b) ballast in the bridge circuit, the resistance value of the insulated joint is determined.

6 Claims, 2 Drawing Sheets

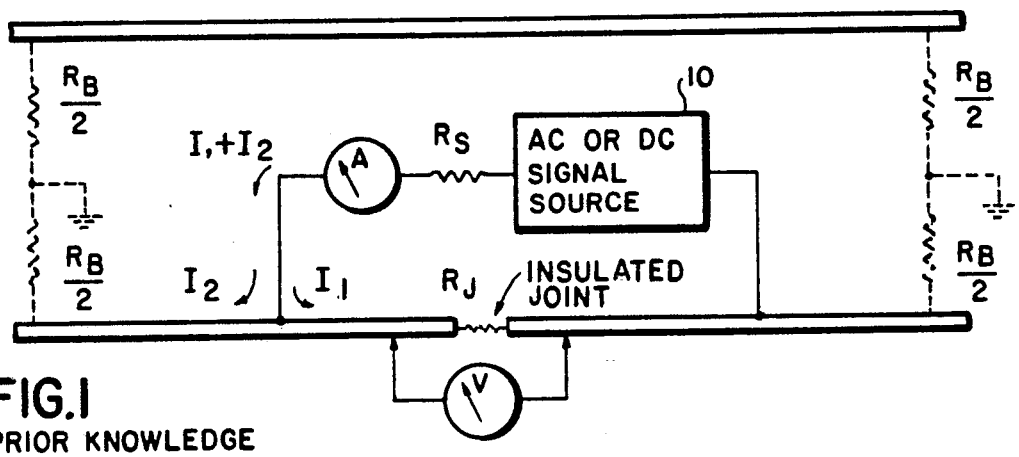
FIG.1
PRIOR KNOWLEDGE
FIG.2A
PRIOR KNOWLEDGE
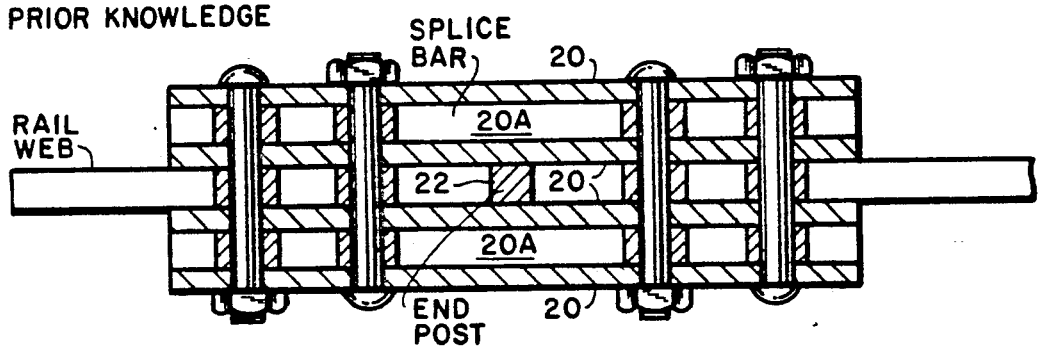
FIG.2B
PRIOR KNOWLEDGE
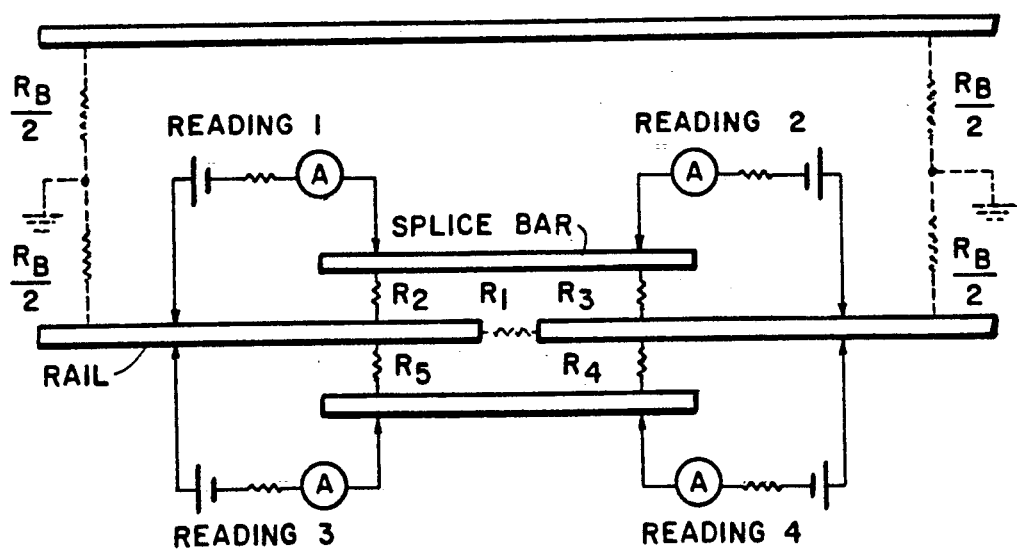

APPARATUS AND METHOD FOR MEASURING INSULATED TRACK JOINT RESISTANCES

BACKGROUND OF THE INVENTION

The present invention relates to the measurement of insulation resistance of a rail joint and, more particularly, to an apparatus and method for so measuring insulation resistance in the presence of leakage ground resistance without the use of calibrated meters or the like.

It has been a practice in the art of railroading to employ track circuits as train occupancy detectors, and as communication links to trains and along the right of way for other train signal functions. Insulated joints are a vital element of many types of track circuits. Provided the track circuits have been properly designed, failure of insulated joints does not create an unsafe condition; however, their failure does create nuisance conditions.

It will be understood that an insulated rail joint provides an electrical insulating barrier in the track for the purpose of isolating one track circuit from an adjacent track circuit, or to preclude the propagated rail-carried cab signals from spilling over into an unwanted track section. Also, since the insulated joint does constitute a mechanical joint in the rail, such joints are subjected to high stress levels due to the constant rolling of railroad wheels over them. As a result, insulated joints have a finite life and therefore pose a maintenance problem.

The problem lies in the need for replacement of the insulation in insulated joints, usually entailing replacement of the entire joint, which can be relatively expensive for jointed-rail track and prohibitively expensive for welded rail track. In the case of welded rail, the insulated joint section needs to be cut out and the new insulated joint section has to be welded in its place.

Because of the substantial difficulty in determining the electrical insulating quality of a new insulated joint, especially in the aforenoted welded rail track, it has not been uncommon to remove suspected leaky insulated joints, only to find, after all, that the joint is satisfactory.

Accordingly, there is a need to be able to determine the resistance of an installed insulated joint in a simple, efficient, and reasonably accurate manner. Although at first blush it would appear to be a very simple task, in reality it has not proven to be the case. This might best be appreciated by referring to FIG. 1, which illustrates the problem. As shown therein, it is easy enough to connect an AC or DC signal source such as the source 10 around an insulated joint whose resistance it would be desirable to determine. While it is then a simple task to measure the voltage drop across the insulated joint, as well as the current flowing from the signal source 10, unfortunately only a portion of the current from the signal source flows through the resistance of the insulated joint, that is, resistor $R_J$. A substantial amount of the source current $I_2$ can flow through the ground on which the track lies, and other run-around paths through the track work, such as impedance bonds and cross bonds.

The present inventors have recognized that the difficulty arises from the fact that there is no easy, direct way of measuring just the current $I_1$ flowing through the insulated joint. One solution would be to measure this current with a clamp-on ammeter around the rail, between the feed point and the insulated joint. Unfortunately, there is no known commercially available clamp-on ammeter with jaws of sufficient size to close around a rail section.

A conventional method which has been widely used for a number of years in the attempt to measure the quality of an insulated joint is shown by reference to FIGS. 2A and 2B. This method is still used by many railroads today. Although this method does not provide a quantitative value for the joint insulation resistance, in many cases it can provide a qualitative measure of the joint resistance.

FIG. 2A illustrates the basic construction of an insulated rail joint. Insulating members 20 provide insulation of the structural metallic splice bars 20A. Members 21 are tubular insulating sleeves which provide insulation of the joint fastening bolts. The "end post" insulating member 22, which is in the shape of the cross-section of the rail, provides the insulation of the rail ends. This end post insulating member is made of such a material that it can stand the high compressive stresses that occur during high ambient temperatures when the rails expand and try to tightly press against each other. All these insulating members work together to electrically insulate one rail from the other. Since high stresses and movement can occur at these mechanical rail joints, this may eventually lead to a mechanical breakdown of the insulating members which cause the insulating quality of the rail joint to deteriorate in time.

FIG. 2B illustrates how the conventional method attempts to determine the quality of an insulated joint. Note that in FIG. 2B, if the resistance of R1 is unacceptably low, but the insulation of the joint or splice bars 20, is good, that is to say, R2, R3, R4, R5 (in FIG. 2B) all have high resistance values, the method will provide results which would indicate that the insulated joint was good, when in reality it was not.

SUMMARY OF THE INVENTION

The present invention overcomes the problem and the consequent difficulty described above by providing an extremely simple solution thereto, a solution which avoids the need for unwieldy large-size components such as clamp-on ammeters having jaws for closing around a rail section.

A primary feature of the present invention, briefly stated, resides in an apparatus and method for measuring the absolute insulation resistance of an insulated rail joint in the presence of leakage ground resistance, such as ballast resistance and other track run-around paths, comprising a track defining pair of rails carrying current; an insulated joint along said rails; a bridge circuit, including a leg having the insulated joint therein, and three other legs, each including a resistor, one of said resistors having a fixed known value and two of said resistors being variable; whereby when said variable resistances are varied to obtain simultaneously both the null of the rail joint and balance of the bridge circuit, the resistance value of the insulated joint is determined.

Another feature or aspect of the present invention is the method or process for separately and efficiently determining the resistance value of an insulated track joint. This method involves the steps of connecting a signal source across the track; connecting a bridge circuit to the two rails of said track, one of the legs of the bridge circuit containing the insulated joint, the other three legs each including a resistor, one of which has a fixed known value and the other two variable; connecting a null detector to a junction point at one side between one of the fixed and one of the variable resistors and at the other side to the junction point between the other variable resistor and the insulated joint resistance.

The specific method includes selecting resistance values, for example, selecting a resistance value of 2 ohms for the signal source resistance, the fixed resistors having a value of 10 ohms, and the variable resistors being in the form of a decade resistor box that can be selected in increments of 0.1 ohms to 100 ohms. The frequency of the signal source is selected to be between 1 kHz and somewhat less than 20 kHz.

It will be understood that as a result of the particular arrangement and method, when the variable resistors are varied to obtain simultaneously both the null of the rail current and balance of the bridge circuit, the resistance value of the insulated joint is determined.

Other and further objects, advantages and features of the present invention will be understood by reference to the following specification in conjunction with the annexed drawing, wherein like parts have been given like numbers.

BRIEF DESCRIPTION OF DRAWING

FIG. 1 is a schematic diagram of an insulated joint resistance measuring technique in accordance with conventional practice.

FIG. 2A is a sectional view of an insulated joint scheme which is well known.

FIG. 2B is a schematic diagram of the conventional arrangement for detecting insulation of an insulated rail joint.

DESCRIPTION OF PREFERRED EMBODIMENT

Figure 3:
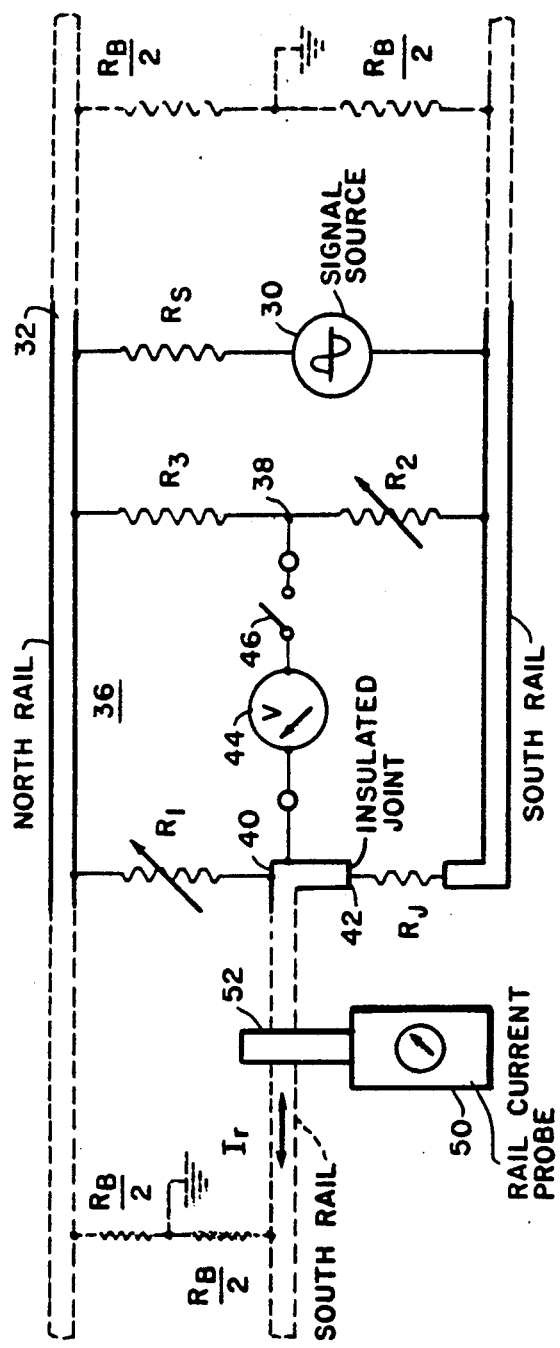
FIG. 3 is a schematic diagram which depicts impedance bridge method and scheme in accordance with the present invention.

Referring now to the figures of the drawing and, for the moment, to FIG. 3 thereof, there is illustrated one embodiment of an impedance bridge device and method in accordance with the present invention, which has been developed to measure the absolute insulation resistance of an insulated joint in the presence of leakage ground resistance. A signal source 30 is connected across the track consisting of rails 32 and 34. It will be noted that the resistance RS, which is the source resistance, is shown in series with source 30.

A bridge circuit 36 is connected to the rails 32 and 34. The bridge circuit includes a fixed resistance R3 connected from the north rail, that is, rail 32, in series with the variable resistance R2 whose other end is connected to the south rail, that is, rail 34. The junction point between R3 and R2 is designated 38. On the other side of the bridge, a variable resistance R1 is seen connected by way of a junction point 40 to the resistance $R_J$ of the insulated joint 42. A null detector 44 and a switch 46 are connected between the junction points 38 and 44 for measurement purposes.

It will be appreciated that the insulated joint 42 is included as one of the legs of the bridge 36, the other resistors of the bridge circuit being the variable resistors R1 and R2 and the third being fixed resistor R3. In a practical embodiment, the variable resistors R1 and R2 take the form of two decade resistor boxes, whose resistance value can be varied and read out on the decade dials or the continuous rotation calibrated analog dial. Such decade resistor boxes are per se well known in the art.

When the apparatus is connected, as shown in FIG. 3, resistor R1 is adjusted until the current sensor, which functions to sense current $I_R$ in the south rail away from the insulated joint under test, detects a current null or dip. The rail current $I_R$ can be sensed by means of a rail current sensing probe 50 whose detailed construction can be appreciated by reference to FIG. 4.

The next step in the method involved is to connect a sensitive voltage detector, that is, the null detector 44, in the form of a voltmeter, between the junction points 38 and 40. Resistor R2 is no adjusted till the voltage sensed by the null detector dips to a minimum or zero value. The adjustment of R2 may upset the balance with R1 and it may be necessary to go back and forth between the adjustments of R1 and R2 to achieve a simultaneous null of both the rail current $I_R$ and the bridge balance null detector.

If a high resistance voltmeter is used for the bridge balance null detector 44, and if a resistance value of 10 ohms or higher is used for the fixed resistor R3, this interaction will be sufficiently reduced so only one adjustment of R1 and R2 is required to achieve both a null of the rail current sensor and to achieve bridge balance by means of the null detector. Once the rail current null and the bridge balance conditions have been fulfilled, the impedance or resistance value of the insulated joint under test, $R_J$, can now be calculated, by multiplying the dial indicator resistance values of R1 and R2 and dividing the resulting product by the known fixed value of R3.

Figure 4:
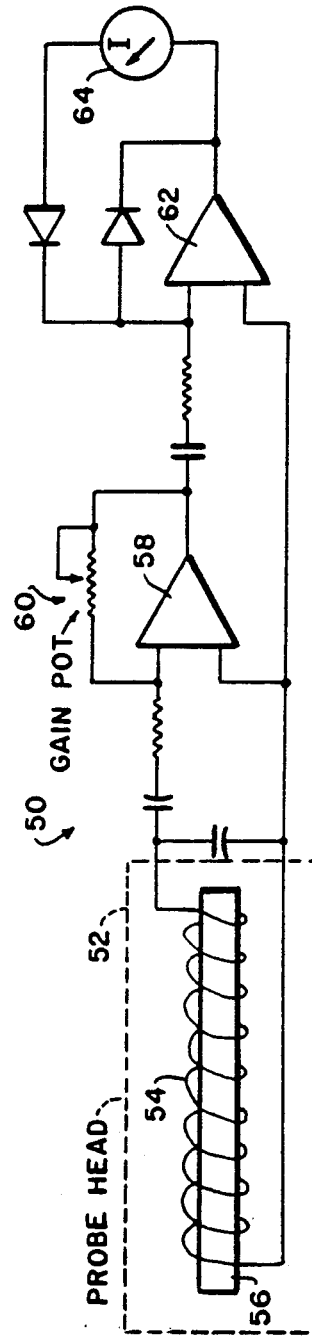
FIG. 4 is a schematic diagram of a rail current sense probe for use in the method of the present invention.

FIG. 4 illustrates an embodiment for the rail current sensing probe 50. The sensor or probe 50 includes a probe head 52 enclosing a pickup coil 54 wound on a ferrite core 56 to concentrate the flux resulting from current $I_R$ flowing through the rail 34. For lower signal frequencies, the core material can be iron lamina, or can be a ferrite rod for higher signal source frequencies.

In the internal circuitry for the probe 50, the pickup coil 54 is parallel tuned to the signal source frequency, so that it is only sensitive to the signal source frequency and not to other foreign noise signals that may be in the rail. The output of the coil 50 is then amplified by an operational amplifier 58, which is provided with conventional input and output components, the gain being controlled by potentiometer 60. Amplifier 58 is followed by an active signal rectifier 62 which in turn drives the DC milliammeter 64.

The gain control permits reducing the sensor gain when sensing a high rail current level and then permits the sensor to have its gain increased as the adjustment of R1 causes the rail current $I_R$ to approach a null point. In operation, the rail current sensor or probe 50 is, as seen in FIG. 3, positioned across the head of the rail, perpendicular to the rail. The probe 52 is then moved across the top of the rail head until the maximum output point is achieved.

In the situation where the railroad is operating in electrified territory, impedance bonds are used to provide a return path for the traction current, but they still function to provide signal isolation between adjacent track circuits. Such a track circuit configuration would present a particular challenge when trying to measure insulated joint resistances. In practice, the scheme or technique described in the present disclosure will perform properly in the presence of such impedance bonds, if the center tap connection normally found between the bonds is temporarily opened during the time the insulated joint resistance measurement is being conducted.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed:

1. Apparatus for measuring the insulation resistance of an insulated rail joint in the presence of leakage ground resistance and the like, comprising:
   a track defined by a pair of rails carrying current;
   an insulated joint in one of said rails;
   a bridge circuit, including a leg having the insulated joint therein; three other legs, each including a resistor, a first and a second of said resistors being variable, and a third having a fixed, known value;
   whereby said variable resistors are varied to obtain both the null point of the rail current and balance of the bridge circuit such that the resistance value of the insulated joint is then determined.

2. Apparatus as defined in claim 1, further comprising a sensor for sensing the rail current to determine the null point as the resistance of said first resistor is varied.

3. Apparatus as defined in claim 2, in which said sensor includes a probe for sensing the rail current, said probe including a head for placement adjacent one of said rails.

4. An apparatus as defined in claim 3, further comprising a null detector connected between a first junction point and a second junction point, the first junction point being at the junction of the first variable resistor and the resistance of the insulated joint, and the second junction point being at the junction of the fixed resistor and the second of said variable resistors for measuring the balance of the bridge, which is achieved when there is no voltage present between the junction points.

5. Apparatus as defined in claim 4, further comprising a signal source for providing current to said pair of rails.

6. A method for measuring the insulation resistance of an insulated rail joint in the presence of leakage ground resistance, the insulated rail joint being in one of a pair of rails defining a track, the rails carrying current comprising the steps of:
   connecting a bridge circuit, including the insulated joint as one leg, and three other legs, two of which have first and second variable resistors, respectively, and one of which has a fixed resistor;
   connecting a source to said rails such that current flows through said rails and said leakage ground resistance;
   sensing the rail current to determine the null point of rail current as the resistance of said first resistor is varied;
   connecting a null detector between opposed junction points in said bridge circuit and sensing a no-voltage condition between said junction points as the resistance of said second resistor is varied;
   determining the value of junction resistance from the adjusted values of the variable resistors and the value of the fixed resistor.

* * * * *